(12) United States Patent
Chamberlin et al.

(10) Patent No.: US 7,915,936 B2
(45) Date of Patent: Mar. 29, 2011

(54) OUTPUT SIGNAL ERROR DETECTION, CIRCUMVENTION, SIGNAL RECONSTRUCTION AND RECOVERY

(75) Inventors: Douglas A. Chamberlin, Trinity, FL (US); Anthony N. DeFazio, Brandon, FL (US)

(73) Assignee: Honeywell International Inc., Morristown, NJ (US)

( * ) Notice: Subject to any disclaimer, the term of this patent is extended or adjusted under 35 U.S.C. 154(b) by 1074 days.

(21) Appl. No.: 11/676,412

(22) Filed: Feb. 19, 2007

(65) Prior Publication Data

US 2010/0271095 A1 Oct. 28, 2010

(51) Int. Cl.
*H03K 5/01* (2006.01)
(52) U.S. Cl. ......................................... 327/166; 327/165
(58) Field of Classification Search .................. 327/165, 327/166
See application file for complete search history.

(56) References Cited

U.S. PATENT DOCUMENTS

| | | | |
|---|---|---|---|
| 3,892,952 A | 7/1975 | Shibata et al. | |
| 4,385,699 A | 5/1983 | Ashina | |
| 4,488,189 A | 12/1984 | Axmear et al. | |
| 4,518,917 A | 5/1985 | Oates et al. | |
| 4,606,316 A | 8/1986 | Komurasaki | |
| 4,712,427 A | 12/1987 | Peters | |
| 5,049,838 A | 9/1991 | Voyce | |
| 5,175,438 A | 12/1992 | Ikeda | |
| 5,282,223 A * | 1/1994 | Muramatsu | 375/214 |
| 5,300,820 A * | 4/1994 | Sayama et al. | 327/165 |
| 5,371,718 A | 12/1994 | Ikeda et al. | |
| 5,479,119 A | 12/1995 | Tice et al. | |
| 5,479,161 A | 12/1995 | Keyes et al. | |
| 5,495,204 A | 2/1996 | Hilby et al. | |
| 5,621,776 A | 4/1997 | Gaubatz | |
| 5,737,961 A | 4/1998 | Hanisko et al. | |
| 6,230,565 B1 | 5/2001 | Foote | |
| 6,462,530 B1 | 10/2002 | Layton | |
| 6,473,713 B1 | 10/2002 | McCall et al. | |
| 6,581,962 B2 | 6/2003 | Miyata et al. | |
| 6,959,240 B2 | 10/2005 | Okamoto | |
| 7,204,123 B2 | 4/2007 | McMahan et al. | |
| 7,661,291 B2 | 2/2010 | McMahan et al. | |
| 2004/0113802 A1 | 6/2004 | Green et al. | |

FOREIGN PATENT DOCUMENTS

| | | |
|---|---|---|
| EP | 1355129 | 10/2003 |
| GB | 2183835 | 6/1987 |
| JP | 63046961 | 2/1988 |
| JP | 6109761 | 4/1994 |
| JP | 07159438 | 6/1995 |

(Continued)

OTHER PUBLICATIONS

Honeywell, "Accelerex RBA Accelerometer", Jan. 2001, Publisher: Honeywell International Inc.

*Primary Examiner* — Lincoln Donovan
*Assistant Examiner* — Ryan C Jager
(74) *Attorney, Agent, or Firm* — Fogg & Powers LLC

(57) ABSTRACT

A method of dealing with anomalies in an output signal is provided. The method includes monitoring transitions in the output signal. When transitions do not occur at expected times, detecting an anomalous signal. Determining the type of anomalous signal based at least in part on the time period of the anomalous signal and conditioning the output signal based on the type of anomalous signal detected.

18 Claims, 3 Drawing Sheets

FOREIGN PATENT DOCUMENTS

| | | |
|---|---|---|
| JP | 2001108702 | 4/2001 |
| JP | 2002031644 | 1/2002 |
| JP | 2002067870 | 3/2002 |
| JP | 2003149261 | 5/2003 |
| WO | 9407150 | 3/1994 |

* cited by examiner

OUTPUT SIGNAL ERROR DETECTION, CIRCUMVENTION, SIGNAL RECONSTRUCTION AND RECOVERY

GOVERNMENT CONTRACT RIGHTS

The U.S. Government may have certain rights in the present invention as provided for by the terms of Government Contract # DASG60-00-C-0072 under program THAAD.

BACKGROUND

Devices that include integrated circuits that generate output signals are prone to have issues when exposed to shock or vibration environments. In particular, during a shock occurrence anomalous outputs can occur which can result in system level errors that are unacceptable. An example of a device that is subject to shock or vibration environments is an accelerometer placed in a missile. The reliance on anomalous accelerometer data by an inertial system of the missile can result in a catastrophic failure.

For the reasons stated above and for other reasons stated below which will become apparent to those skilled in the art upon reading and understanding the present specification, there is a need in the art for an effective method of dealing with anomalous outputs of integrated circuits.

SUMMARY OF INVENTION

The above-mentioned problems of current systems are addressed by embodiments of the present invention and will be understood by reading and studying the following specification. The following summary is made by way of example and not by way of limitation. It is merely provided to aid the reader in understanding some of the aspects of the invention. In one embodiment, a method of dealing with anomalies in an output signal is provided. The method includes monitoring transitions in the output signal. When transitions do not occur at expected times, the method detects an anomalous signal. Determining the type of anomalous signal based at least in part on the time period of the anomalous signal and conditioning the output signal based on the type of anomalous signal detected.

BRIEF DESCRIPTION OF THE DRAWINGS

The present invention can be more easily understood and further advantages and uses thereof more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
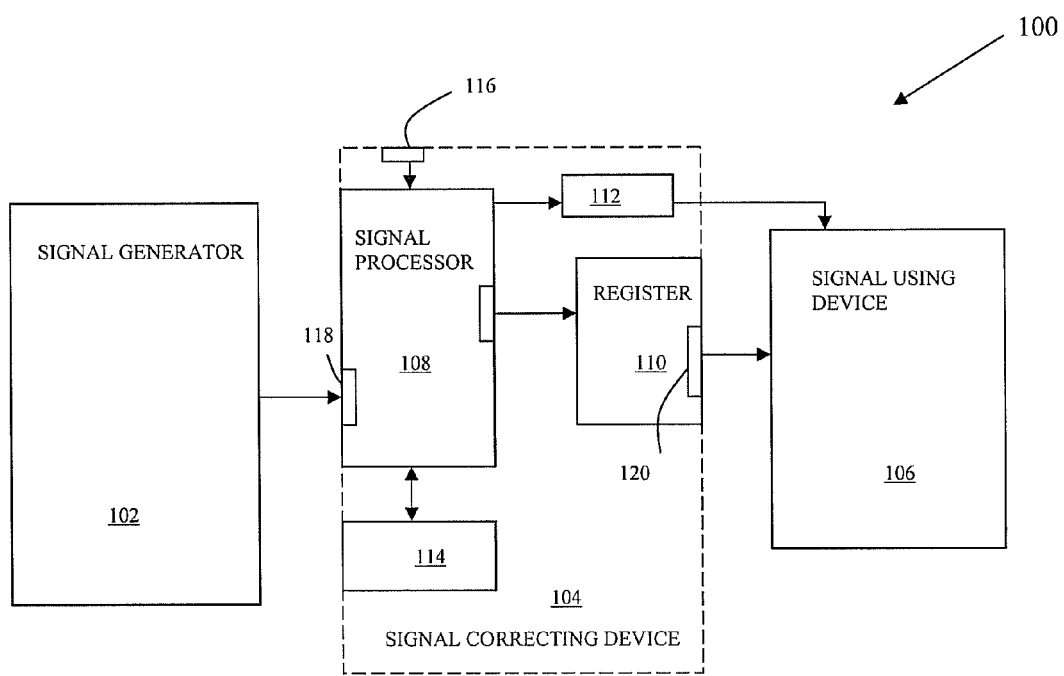
FIG. 1 is a block diagram of a signal correcting system of one embodiment of the present invention is provided.

Embodiments of the present invention provide a method that detects and corrects (or conditions) anomalous signals that is transparent to a system using the signals. Referring to FIG. 1, a system 100 including a signal correcting device 104 of one embodiment of the present invention is illustrated. The system 100 includes a signal generator 102, a signal using device 106 and the signal correcting device 104. Although, any type of signal generator 102 and signal using device could be used with this invention an example of a signal generator 102 is an accelerometer and an example of the signal using device 106 is a navigation system.

The signal correcting device 104 includes a signal processor 108 and a register 110. As illustrated the signal processor 108 is coupled to receive an output of the signal generator 102 via input port 118. The signal processor 108 monitors the output signal for anomalous signals. When a anomalous signal is detected it is either skipped or replaced. The signal processor 108 then sends the corrected (or conditioned) signal to the register 110. Once the signal using device 106 is ready to process the signal from the signal generator 102, the signal in the register 110 is passed on to the signal using device 106 via output port 120. The signal processor 108 is able to correct anomalous signals without the signal using device 106 knowing of the correction because the signal processor 108 operates at faster speed than the signal using device 106. This allows the signal correcting device 104 to have time to correct an anomalous signals.

In embodiments of the present invention, anomalous signals are sorted into different types. The types of anomalous signals include signals designated as either a glitch or a bursting anomaly. A glitch is a type of anomalous signal that only occurs for relatively short period of time. In embodiments of the present invention the relatively short period of time is user defined. This select time period is dependant on the application. In particular in some embodiments, a glitch duration variable is loaded into the signal correcting device 104, via input port 116, to be used by the signal processor 108. The glitch duration variable sets the select period of time. An example of a detected glitch is where a transition is encountered at a time that would be outside the range of frequency but the next transition occurs at an expected time within the frequency range. A bursting signal is a type of anomalous signal that occurs over a relatively long period of time. That is, bursting signals are glitches that occur continuously for a select period of time based on the type of signal generator. The bursting duration is a variable that is loaded into the signal correcting device 104. The signal processor 108 tracks glitches and bursting with a counter circuit 114. The counter circuit 114 includes one or more counters. In one embodiment, a counter in the counter circuit 114 is set when a transition does or does not occur when expected. As discussed, the processor then uses the counter to determine the period of time of the anomalous signal. If the anomalous signal returns back to its expected frequency before the end of the select period of time, a glitch has been detected. If a series of Glitch transitions occur beyond the select period of time, a burst has been detected. Once the signal has returned to it expected frequency the counter is reset.

In some embodiments, the signal correcting device 104 tracks glitch and bursting events. This information can then be sent to an exterior processor for processing. In one embodiment, a discrete register 112 is used as illustrated in FIG. 1. The signal processor 108 in the signal correcting device reports all occurrence of glitch rejections and all occurrence of level transition timeout used during bursting to discrete register 112. As illustrated, in this embodiment, an output of register 112 is used by the signal using device 106 for further conditioning.

Figure 2:
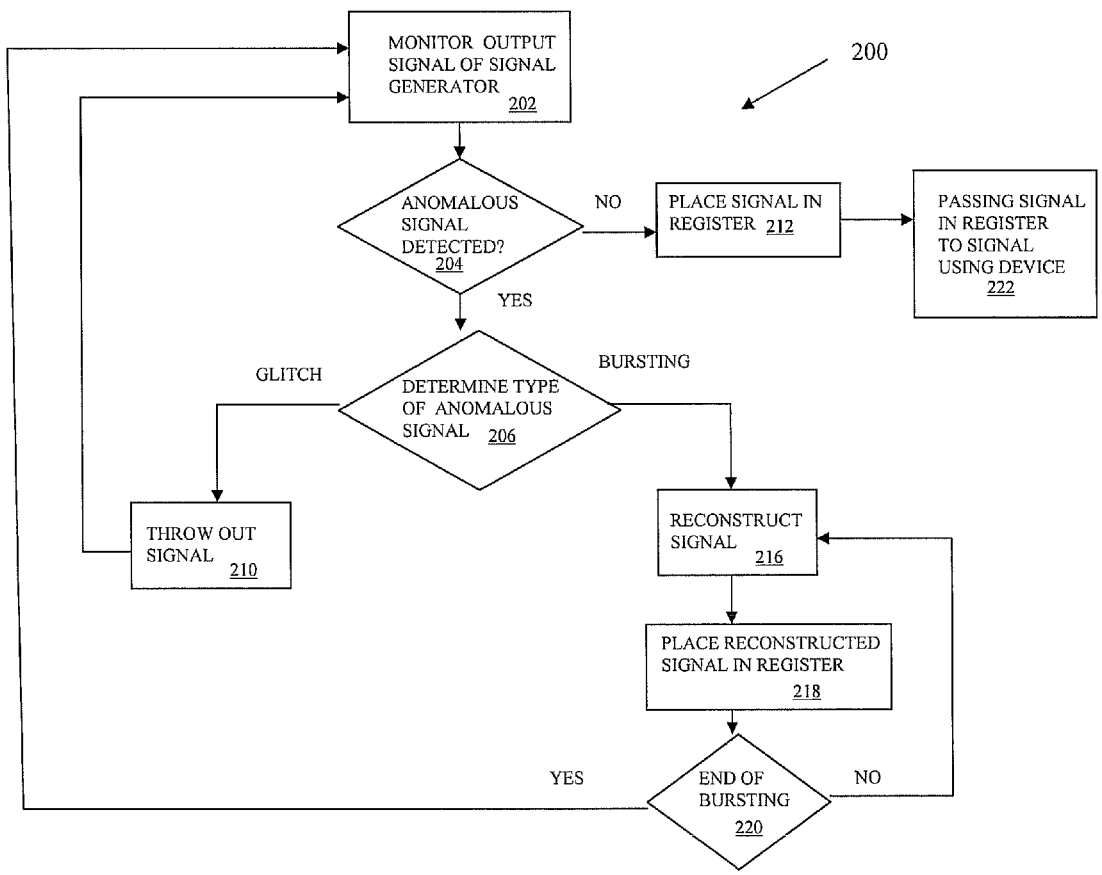
FIG. 2 is a flow diagram of a method of correcting an anomalous signal of one embodiment of the present invention.

A signal processing flow diagram 200 of one method of implementing an embodiment of the present invention is illustrated in FIG. 2. As illustrated, the method starts by monitoring the output signal of a signal generator (202). The output signal is monitored for an anomalous signal (204). In one embodiment, this is done by monitoring the frequency of the output signal from the signal generator 102. Depending on the application, a normal frequency range is selected. In this embodiment, it is determined if the frequency of the output signal is within the normal frequency range. The frequency is determined in one embodiment by counting the number of transitions between states in the signal within a given time period. If the frequency of the output signal of the signal generator 102 is outside the frequency range an anomalous signal has been detected. If an anomalous signal is detected (204), the type of anomalous signal is determined (206).

If the anomalous signal is determined to be a glitch (206), the anomalous portion is simply thrown out by the signal processor (210). As discussed above, since, the signal generator 102 has a higher frequency than the signal using device 106, the removal of the glitch will not be noticed by the signal using device 106. Once the anomalous glitch signal is thrown out (210), the output signal is again monitored at (202). If the anomalous signal is determined to be bursting (206), the bursting portion of the signal is replaced or reconstructed (216). There are many different ways in which the signal can be reconstructed. For example in one embodiment a programmed replacement signal is simply used. That is, in the embodiment, a signal of a select frequency is pre-programmed in and used to replace the bursting signal. In another embodiment, the signal processor 108 uses a signal having a frequency that that was occurring right before bursting was detected. In still another embodiment where a signal output generator 102 outputs more than one output signal and the output signals have a proportional relation, a second non-anomalous signal is used to create a replacement signal. Other methods of generating a signal to replace an anomalous signal are contemplated and the above are given by way of example not by way of limitation. The reconstructed signal is then placed in the register (218). Moreover, during a bursting signal, the signal correcting device 104 reconstructs the signal generators output by enabling a transition from the existing level state of the signal after a timeout duration from a previous transition.

Embodiments of the present invention then determine when the bursting has ended (220). If it has not ended (218), the signal processor continues to reconstruct the signal at (216). When it is determined the bursting has ended 220, the process continues at (202) where the output signal is continued to be monitored (202) and placed in the register (212) if no other anomalous signals have been detected (204). In particular, the signal is monitored to determine when the bursting has ended (220). Once the bursting has ended, the reconstructed signal is stopped and the output signal is transitioned back into the signal stream such that the replacement is transparent to the signal using device 106. In particular, a transition is coincident with the actual signal level change following a timeout.

Figure 3:
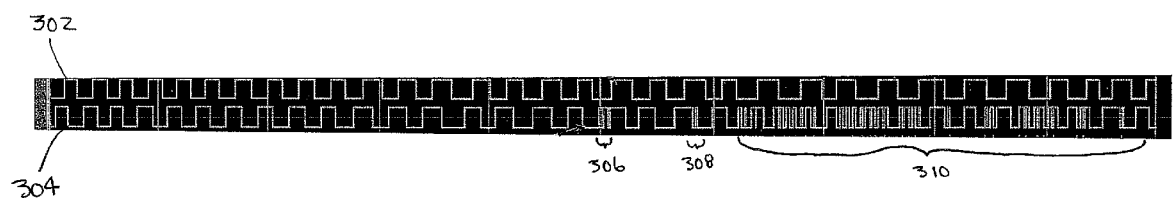
FIG. 3 is a signal diagram illustration an anomalous signal and a corrected signal of one embodiment of the present invention.

Referring to FIG. 3, an example of an anomalous signal 304 and a replacement signal 302 is illustrated. In particular, signal 304 represents a signal from a signal generator, such as an accelerometer that is communicated to the signal correcting device 104. Signal 302 represents a reconfigured signal that would be output from the signal correcting device 104 and used by the signal using device 106. In regards to the anomalous signal 304, glitches 306 and 308 as well as bursting 310 are shown. As illustrated, the glitches 304, 306 and 308 are replaced in signal 302 with the signal correcting device 104 of the present invention. FIG. 3 also illustrates, that the transition edges are not aligned with respect to anomalous signal 304 and the replaced or corrected signal 302. The shift in transition edges reflects the time used to analysis and correct the signal.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs) or a field programmable gate array (FPGA).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of dealing with anomalous outputs of a device, the method comprising:
   detecting anomalous signals from the first device;
   determining whether the anomalous signal is a glitch or a burst, wherein a glitch is a disturbance over a relatively short period of time and a burst is a disturbance over a relatively extended period of time;
   correcting the anomalous signals based on the determination that the anomalous signal is either a glitch or a burst, wherein a glitch is corrected differently than a burst; and outputting the corrected signals, wherein correcting the signals is transparent to a second device receiving the outputted corrected signals.

2. The method of claim 1, wherein determining that the anomalous signal is a glitch comprises:
   detecting a transition edge in a signal from the first device;
   using a clock to determine when the next transition edge should occur;
   when a transition edge does not occur within a selected time, waiting for a subsequent transition edge; and
   when a subsequent transition edge is detected, outputting the transition edge.

3. The method of claim 1, further comprising:
   defining the relatively short period of time.

4. The method of claim 1, wherein correcting the anomalous signals further comprises:
   when determining that the anomalous signal is a glitch, removing the glitch.

5. The method of claim 4, wherein removing the glitch further comprises:
   placing a next valid transition in a register to be output instead of the determined glitch.

6. The method of claim 1, wherein correcting the anomalous signals further comprises:
   when determining that the anomalous signal is a burst, reconstructing the anomalous signal to an expected signal.

7. The method of claim 6, further comprising:
   placing the reconstructed signal in a register to be output.

8. A method of dealing with anomalies in an output signal, the method comprising:
   monitoring transitions in the output signal;
   when transitions do not occur at expected times, detecting an anomalous signal;
   determining the type of anomalous signal based at least in part on the time period of the anomalous signal, wherein the anomalous signal is determined to be a glitch if the anomalous signal lasts for less than a select period of time and the anomalous signal is determined to be a burst if the anomalous signal lasts for longer than the select period of time; and
   conditioning the output signal based on the type of anomalous signal detected, wherein the output signal is conditioned differently when the anomalous signal is a glitch than when the anomalous signal is a burst.

9. The method of claim 8, wherein determining the time period of the anomalous signal further comprises:
   starting a counter at the start of the detected anomalous signal; and
   reading a value of the counter.

10. The method of claim 8, further comprising:
    defining the select period of time for Glitch and Burst detection.

11. The method of claim 8, wherein conditioning the output signal based on the type of anomalous signal detected further comprises:
    when the type of anomalous signal is designated as a glitch, removing the anomalous signal portion from the output signal; and
    when the type of anomalous signal is designated as bursting, replacing the anomalous signal portion of the output signal with a reconstructed signal.

12. The method of claim 11, wherein replacing the anomalous signal portion of the output signal further comprises at least one of; using a reconstructed signal with a programmed frequency, using a signal having a frequency that occurred right before detection of the anomalous signal, and using a signal based off of a second different output signal that has a proportional relationship to the output signal.

13. A signal conditioning device, the device comprising:
    a signal processor configured to process an output signal from a signal generator, the signal processor further configured to detect anomalous portions of the output signal, the signal processor further adapted to determine whether a type of anomalous signal detected is a glitch or a burst, wherein the type of anomalous signal is a glitch when the anomalous signal lasts for a relatively short user defined period of time and the type of anomalous signal is a burst when the anomalous signal occurs continuously for a user defined period of time and process the anomalous portion based on a determined type of anomalous signal, wherein a glitch is processed differently than a burst; and
    an output register configured to store and output the output signal to a signal using device, the output register further configured to store the output signal from the signal processor.

14. The device of claim 13, wherein the signal processor is configured to throw out glitch portions of an anomalous signal and reconstruct bursting portions of the an anomalous signal.

15. The device of claim 13, further comprising:
    a counter circuit having at least one counter, the at least one counter configured to time anomalous portions of the output signal for the signal processor.

16. The device of claim 13, further comprising:
    a discrete register configured to track and output occurrences of anomalous portions of the output signal for further conditioning by the Signal Processing Device.

17. The device of claim 13, further comprising:
    an instruction port in communication with the signal processor, the input port configured to convey instructions to the signal processor relating to user defined periods that define the type of anomalous signals.

18. The device of claim 13 further comprising:
    an input port configured to receive an output signal from the signal generator, the input port in communication with the signal processor; and
    an output port configured to output the output signal from the register.

* * * * *

UNITED STATES PATENT AND TRADEMARK OFFICE
CERTIFICATE OF CORRECTION

| | | |
|---|---|---|
| PATENT NO. | : 7,915,936 B2 | Page 1 of 1 |
| APPLICATION NO. | : 11/676412 | |
| DATED | : March 29, 2011 | |
| INVENTOR(S) | : Chamberlin et al. | |

It is certified that error appears in the above-identified patent and that said Letters Patent is hereby corrected as shown below:

At Claim 14, Column 6, Line 34, replace "portions of the an anomalous" with --portions of the anomalous--

Signed and Sealed this
Sixth Day of March, 2012

David J. Kappos
*Director of the United States Patent and Trademark Office*